United States Patent
Chang et al.

(10) Patent No.: US 8,855,428 B2
(45) Date of Patent: Oct. 7, 2014

(54) COMPUTING DEVICE AND BOUNDARY LINE GRAPH CHECKING METHOD

(71) Applicants: Chih-Kuang Chang, New Taipei (TW); Xin-Yuan Wu, Shenzhen (CN); Run-Hui Wu, Shenzhen (CN)

(72) Inventors: Chih-Kuang Chang, New Taipei (TW); Xin-Yuan Wu, Shenzhen (CN); Run-Hui Wu, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 81 days.

(21) Appl. No.: 13/664,429

(22) Filed: Oct. 31, 2012

(65) Prior Publication Data
US 2013/0136366 A1 May 30, 2013

(30) Foreign Application Priority Data
Nov. 25, 2011 (CN) .......................... 2011 1 0380517

(51) Int. Cl.
G06K 9/00 (2006.01)
G06K 9/48 (2006.01)

(52) U.S. Cl.
USPC ......................................... 382/199; 382/100

(58) Field of Classification Search
USPC ................................................ 382/199, 100
See application file for complete search history.

(56) References Cited

U.S. PATENT DOCUMENTS

| 4,944,034 | A | * | 7/1990 | Ohsawa | 345/419 |
|---|---|---|---|---|---|
| 5,448,686 | A | * | 9/1995 | Borrel et al. | 345/420 |
| 5,497,451 | A | * | 3/1996 | Holmes | 345/420 |
| 5,923,573 | A | * | 7/1999 | Hatanaka | 703/2 |
| 6,535,213 | B1 | * | 3/2003 | Ogino et al. | 345/442 |
| 7,301,672 | B2 | * | 11/2007 | Abe et al. | 358/1.9 |
| 7,310,778 | B2 | * | 12/2007 | Taguchi | 715/763 |
| 8,339,401 | B2 | * | 12/2012 | Chang et al. | 345/442 |

* cited by examiner

*Primary Examiner* — Utpal Shah
(74) *Attorney, Agent, or Firm* — Novak Druce Connolly Bove + Quigg LLP

(57) ABSTRACT

A method for checking a boundary line graph using a computing device. The computing device adds a segment line between two adjacent endpoints of the boundary line graph, if the two adjacent endpoints are not connected using the segment line. The computing device removes the segment lines of the endpoints corresponding to intersection points, if the number of the intersection points is not equal to the number of the endpoints. The computing device changes label characters of the endpoints to be arranged in a predetermined order, if an order of the label characters of the endpoints is not a predetermined order according to the boundary line vector.

20 Claims, 9 Drawing Sheets

COMPUTING DEVICE AND BOUNDARY LINE GRAPH CHECKING METHOD

BACKGROUND

1. Technical Field

Embodiments of the present disclosure generally relate to measurement technology, and more particularly to a boundary line graph checking method using a computing device.

2. Description of Related Art

When a boundary line graph of a product (e.g., a shell of a mobile phone) is generated based on a plurality of endpoints, the designer needs to check all details of the boundary line graph. Sometimes, the boundary line graph may be incorrect. For example, the boundary line graph may have an opening and is not closed. Therefore, the designer needs to check if the boundary line graph are correct. However, at present, the designer manually checks the boundary line graph, which is very time-consuming, especially when the boundary line graph is huge and complicated. Therefore, there is room for improvement in the art.

DETAILED DESCRIPTION

The disclosure, including the accompanying drawings, is illustrated by way of example and not by way of limitation. It should be noted that references to "an" or "one" embodiment in this disclosure are not necessarily to the same embodiment, and such references mean at least one.

In general, the word "module," as used herein, refers to logic embodied in hardware or firmware, or to a collection of software instructions, written in a programming language. One or more software instructions in the modules may be embedded in firmware, such as in an EPROM. The modules described herein may be implemented as either software and/or hardware modules and may be stored in any type of non-transitory computer-readable medium or other storage device. Some non-limiting examples of non-transitory computer-readable media include CDs, DVDs, BLU-RAY, flash memory, and hard disk drives.

Figure 1:
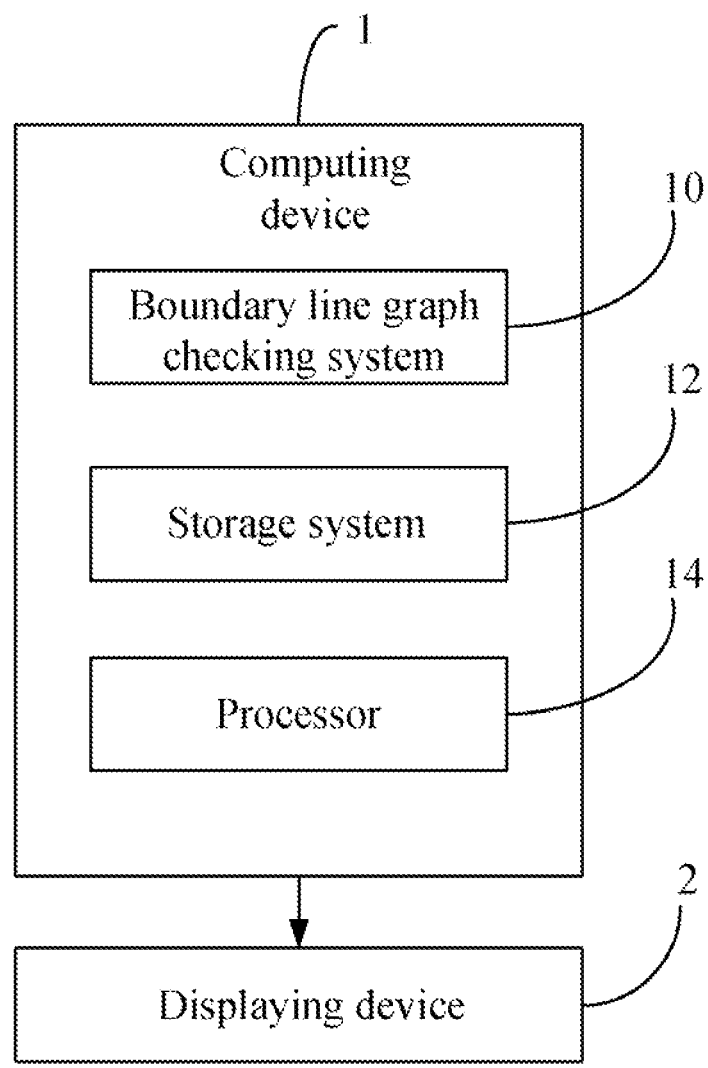
FIG. 1 is a block diagram of one embodiment of a computing device including a boundary line graph checking system.
Figure 4:
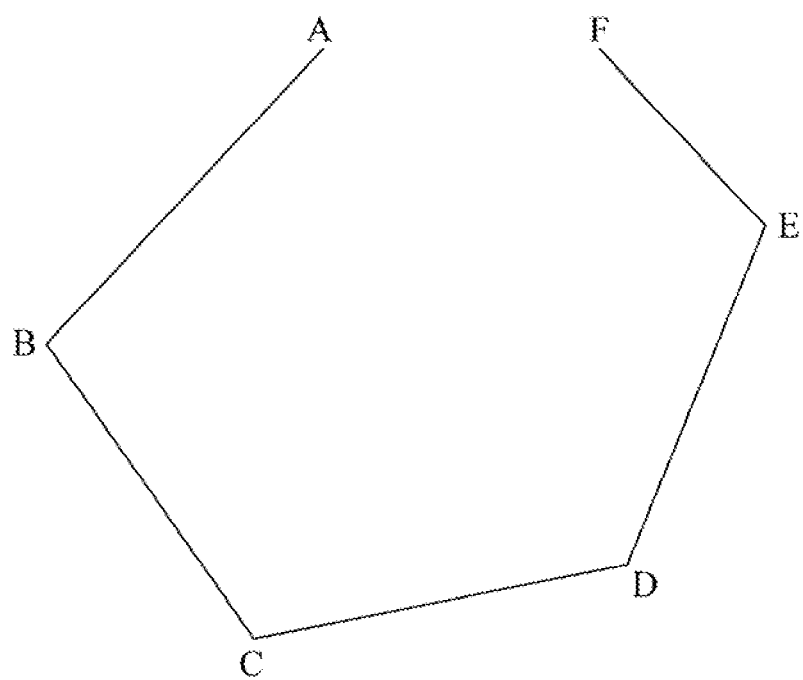
FIG. 4 illustrates one embodiment of an unclosed boundary line graph.
Figure 6:
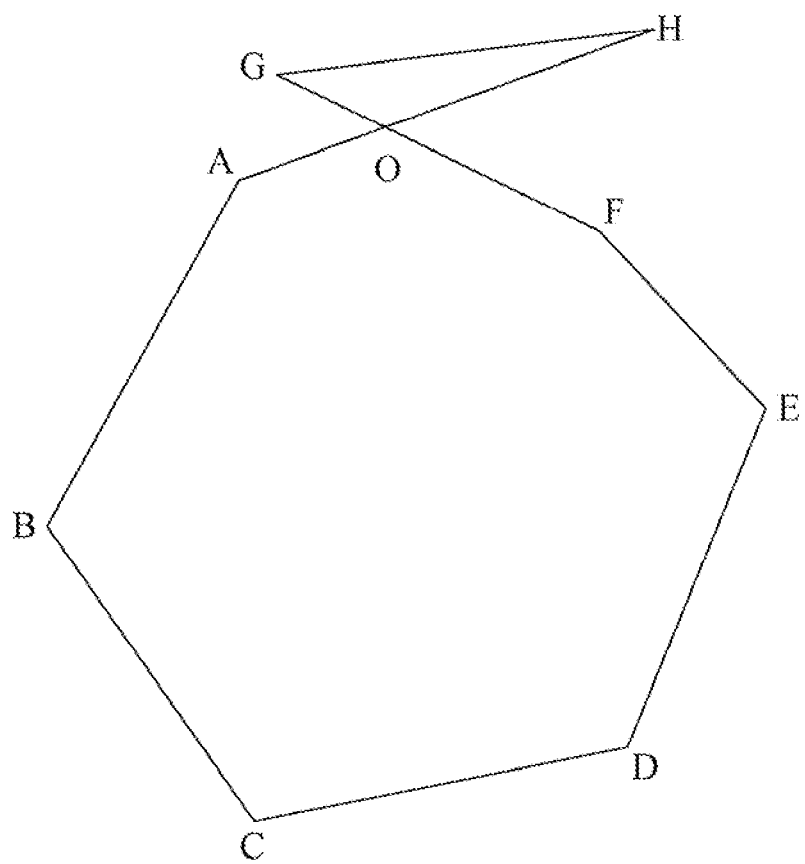
FIG. 6 illustrates one embodiment of an intersection boundary line graph.

FIG. 1 is a block diagram of one embodiment of a computing device 1 including a boundary line graph checking system 10. In the embodiment, the functions of the boundary line graph checking system 10 are implemented by the computing device 1. The boundary line graph checking system 10 may be used to automatically check boundary line graphs. The boundary line graphs may be a surface of a product (e.g., the surface of a mobile phone). The boundary line graphs are generated by an image drawing application, such as, a computer aided design (CAD). Each boundary line graph includes a plurality of endpoints. Each endpoint is labeled with a label character in order (e.g., using alphabetical characters from A to Z, or using numerals from "1" to "40"). Two adjacent endpoints may be connected using a segment line which is also regarded as a boundary line. The two endpoints are determined as the two adjacent endpoints by the label characters of the two endpoints in order, not determined by a distance between the two endpoints. For example, if the label characters is the English letters, the two label characters of the two adjacent endpoints are consecutive in order. As shown in FIG. 4, label characters A and B are consecutive in order, then the endpoints A and B are regarded as two adjacent endpoints. As shown in FIG. 6, the label characters F and G are consecutive in order, then the endpoints F and G are regarded as two adjacent endpoints. Even the distance between the endpoints F and G may be shorter than the distance between the endpoints F and H, the endpoints F and H are not regarded as two adjacent endpoints. Additionally, the first label character and the last label character of two endpoints are also regarded as two adjacent endpoints. As shown in FIG. 4, the label character A is the first label character and the label character F is the last label character, the endpoints A and the endpoint F are regarded as two adjacent endpoints.

Figure 5:
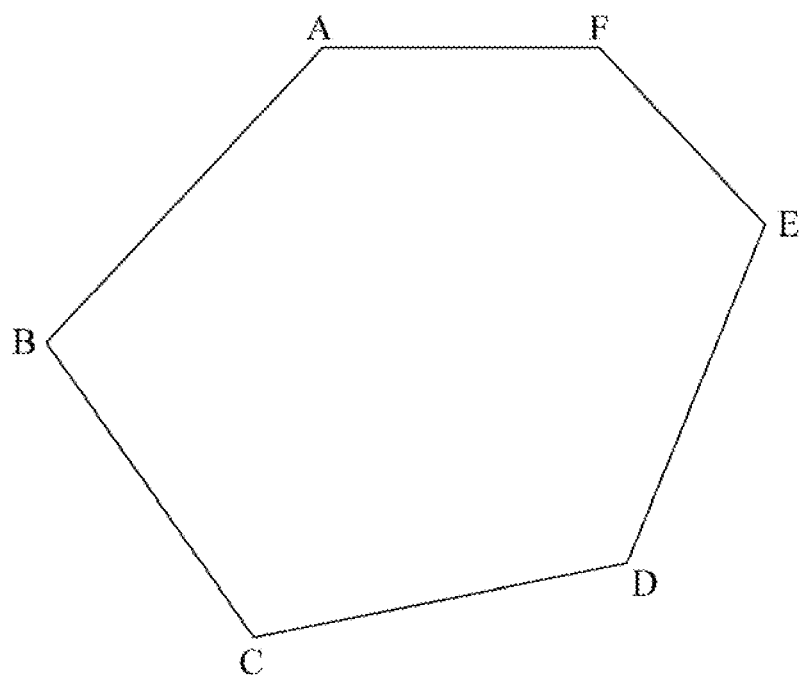
FIG. 5 illustrates one embodiment of a closed boundary line graph.

Additionally, if two adjacent endpoints in the boundary line graph are not connected to each other, the boundary line graph is a unclosed boundary line graph. For example, as shown in FIG. 4, the two adjacent endpoints A and F are not connected, then the boundary line graph is a unclosed boundary line graph. If all of the two adjacent endpoints in the boundary line graph are connected to each other using segment lines, the boundary line graph of FIG. 4 is a closed boundary line graph. For example, as shown in FIG. 5, all of the two adjacent endpoints from the endpoint A to the endpoint F are connected using the segment lines, the boundary line graph of FIG. 5 is a closed boundary line graph. If any two segment lines in the boundary line graph intersect at a point which is not the endpoint, the boundary line graph is an intersection boundary line graph. For example, as shown in FIG. 6, the segment line FG and the segment line AH intersects at the point O, the point O is not the end points, the boundary line graph of FIG. 6 is the intersection boundary line graph. The computing device 1 further comprises a plurality of peripherals that are connected to the computing device 1, such as a keyboard, and a mouse. The peripherals may be used to input or output various computing device signals or interfaces. The computing device 1 provides an operation interface for a user to control one or more operations of the computing device 2.

In one embodiment, the computing device 1 may be a computer, a server, a portable electronic device, or any other electronic device that includes a storage system 12, and at least one processor 14. In one embodiment, the storage system 12 may be a magnetic or an optical storage system, such as a hard disk drive (HDD), an optical drive, a compact disc, a digital video disc, a tape drive, a flash drive, a flash memory, an erasable programmable read only memory (EPROM), a flash memory, or other suitable storage medium. The storage system stores the boundary line graphs. The boundary line graph include a label character of each endpoint in the boundary line graph, coordinates of each endpoint in the boundary line graph, and a formula of each segment line which connects two adjacent endpoints in the boundary line graphs. For example, as shown in FIG. 4, the segment line AB is represented as the formula (e.g., Y=5X+3, wherein X falls within [1 centimeter, 6 cm]). The processor 14 may be a central processing unit including a math co-processor, for example.

The computing device 1 is connected to a displaying device 2. The displaying device 2 is operable to display the boundary line graphs.

Figure 2:
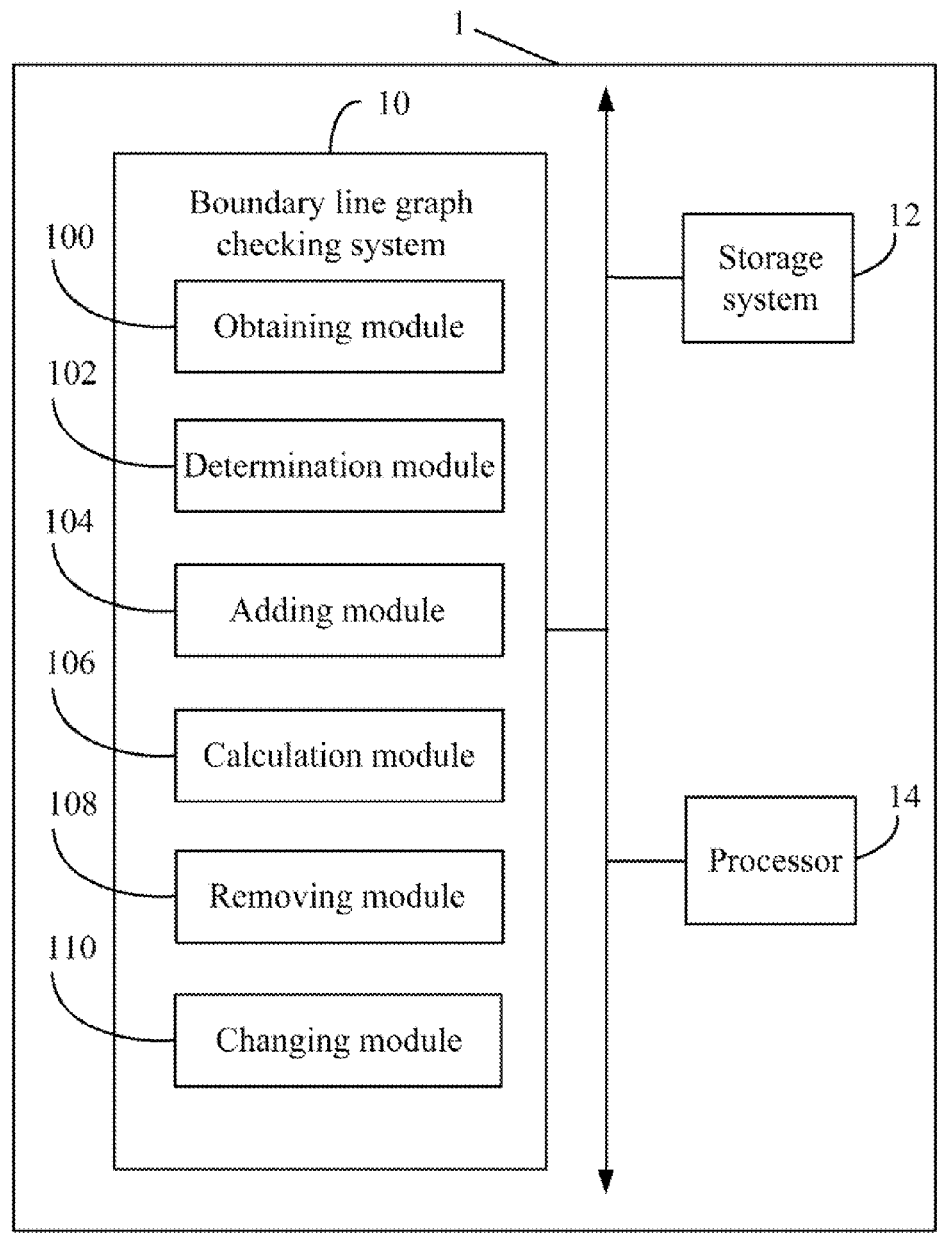
FIG. 2 is a block diagram of one embodiment of the boundary line graph checking system in FIG. 1.

FIG. 2 is a block diagram of one embodiment of the computing device 1 including a boundary line graph checking system 10. In one embodiment, the boundary line graph checking system 10 includes an obtaining module 100, a determination module 102, an adding module 104, a calculation module 106, a removing module 108, and a changing module 110. The modules 100-110 may include computerized code in the form of one or more programs that are stored in the storage system 12. The computerized code includes instructions that are executed by the at least one processor 14 to provide functions for modules 100-110.

The obtaining module 100 obtains a boundary line graph from the storage system 12. The boundary line graph may be saved as a format (e.g., a drawing interchange format, DXF) into the storage system 12.

The determination module 102 determines if all of the two adjacent endpoints are connected using the segment lines. In one embodiment, if the number of the endpoints is equal to the number of the formulas of the segment lines, then all of the two adjacent endpoints are connected using the segment line. For example, as shown in FIG. 5, the boundary line graph includes six endpoints, the boundary line graph includes six formulas of the segment lines, then all of the two adjacent endpoints are connected using the segment line.

The adding module 104 adds a segment line between the two adjacent endpoints which are not connected, if the two adjacent endpoints are not connected using the segment line. For example, as shown in FIG. 4, the adjacent endpoints A and F are not connected, the adding module 104 adds the segment line between the endpoints A and F and generates the formula of the segment line AF by the coordinates of the endpoints A and F.

The calculation module 106 calculates the number of intersection points among the segment lines. Each intersection point is located at a position where two segment lines intersect together, the endpoints are also intersection points. For example, as shown in FIG. 4, the endpoint B is the intersection point where the segment line AB and the segment line BC intersect together. In one embodiment, the calculation module 106 uses the formula of the segment lines to calculate the coordinates of the intersection points, and then calculates the number of the intersection points.

The determination module 102 determines if the number of the intersection points are equal to the number of the endpoints. If the number of the intersection points are unequal to the number of the endpoints, at least one or more intersection points are not the endpoints, then at least two segment lines do not intersect at the endpoints. For example, the number of the intersection points is nine, and the number of the endpoints is eight, then one intersection point is not the endpoint. As shown in FIG. 6, the segment lines AH and GF intersects at the intersection point O, and the intersection point O is not the endpoint.

Figure 7:
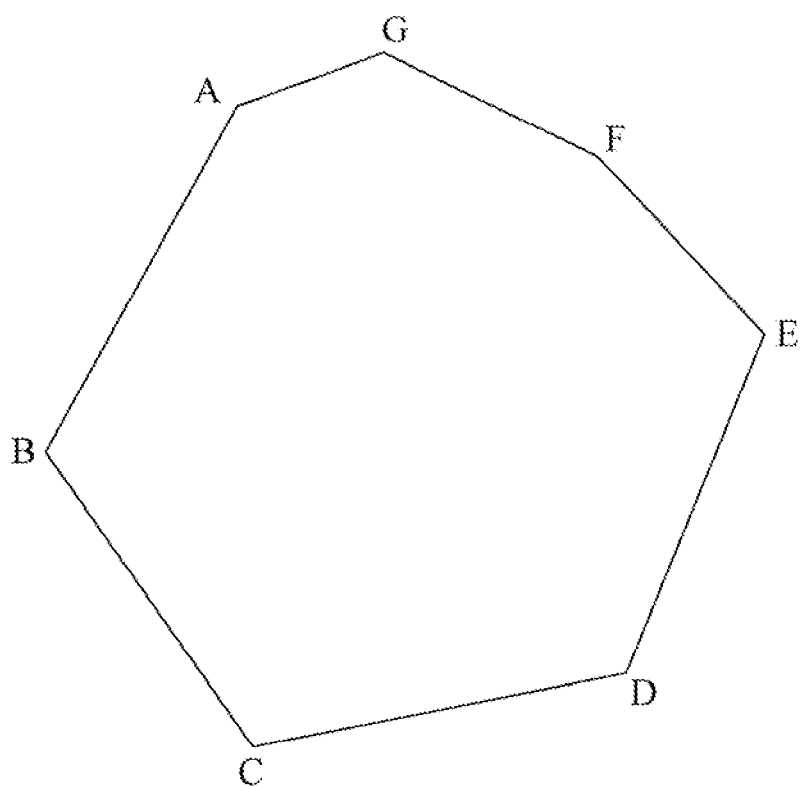
FIG. 7 illustrates one embodiment of the closed boundary line graph which is changed from the intersection boundary graph.

The removing module 108 searches for the intersection points which are not the endpoints, removes the segment lines of the endpoints corresponding to the intersection points. In one embodiment, the removing module 108 determines if the coordinates of each intersection point match the coordinates of the endpoints. If the coordinates of one intersection point does not match the coordinates of any endpoints, the intersection point is not the endpoint. The removing module 108 further removes the segment lines of the endpoints corresponding to the intersection points, and renames the label character of the intersection points in order. For example, as shown in FIG. 6, the point O is the intersection point, the removing module 108 removes three segment lines OG, OH and GF, and renames the intersection point O to be the label character of G, then the boundary line graph of the FIG. 6 is changed to be FIG. 7.

The calculation module 106 calculates a boundary line vector, which is vertical to the boundary line graph. In one embodiment, a segment line of two endpoints is randomly selected in the boundary graph, and a midpoint of the segment line of the two endpoints is obtained. An inside point is also selected inside the boundary line graph. The inside point needs to satisfy a condition as follows: the segment line generated by the inside point and the midpoint is vertical to the selected segment line of the two endpoints. The calculation module 106 calculates a first vector V1 of the segment line of the two endpoints and a second vector V2 of the segment line of the inside point and the midpoint, then boundary line vector is obtained by multiplying the first vector V1 and the second vector V2.

Figure 8:
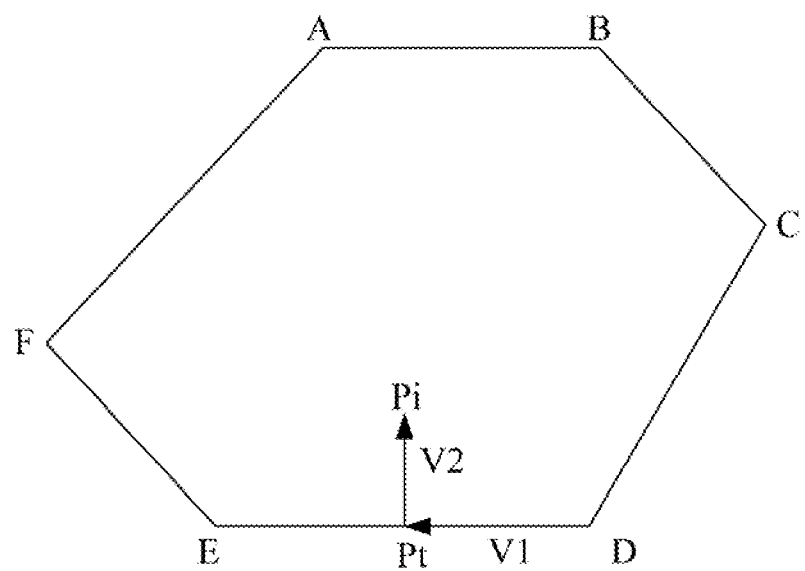
FIG. 8 illustrates one embodiment of an order of label characters of endpoints in the closed boundary line graph are arranged in a clockwise direction.

The determination module 102 determines if an order of label characters of the endpoints is a predetermined order according to the boundary line vector. In one embodiment, the predetermined order may be a counterclockwise direction. For example, as shown in FIG. 8, the boundary line graph starts from the endpoint A and ends at the endpoint F, the order of the label characters of the endpoints from A to F is a clockwise direction, and is not a predetermined order. If the boundary line vector V3 directs from the displaying device 2, the order of label characters of the endpoints is determined as the clockwise direction. If the boundary line vector V3 directs into the displaying device 2, the order of label characters of the endpoints is determined as the counterclockwise direction.

Figure 9:
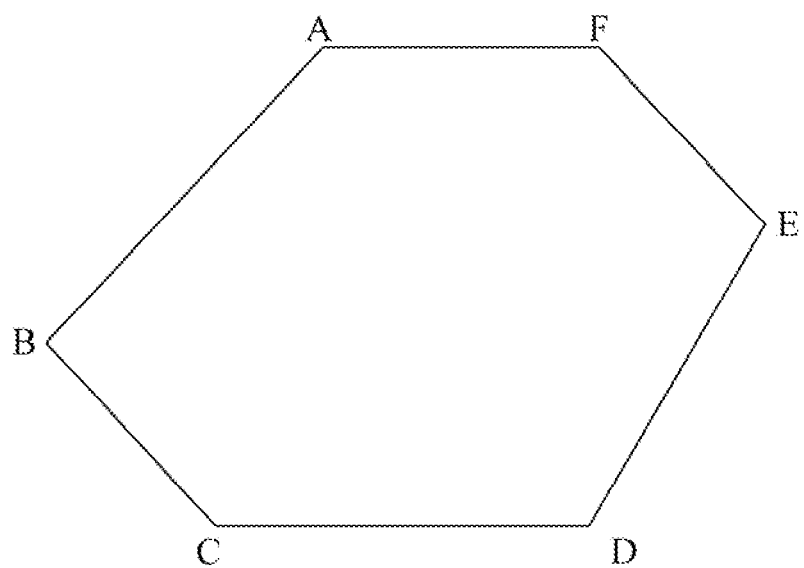
FIG. 9 illustrates one embodiment of the order of label characters of endpoints in the closed boundary line graph are arranged in a counterclockwise direction.

The changing module 110 changes the label characters of the endpoints to be arranged in the predetermined order. In one embodiment, as shown in FIG. 9, the boundary line graph still starts from the endpoint A, and the rest of the label character of the endpoints B to F is arranged in the counterclockwise direction. The label characters of the endpoints are changed, and the coordinates of each endpoint stay the same. For example, as shown in FIG. 8, assuming that the endpoint includes the label character B and coordinates (3 cm, 6 cm), another endpoint includes the label character F and coordinates (5 cm, 4 cm). After exchange, the endpoint includes the label character F and coordinates (3 cm, 6 cm), another endpoint includes the label character B and coordinates (5 cm, 4 cm).

Figure 3:
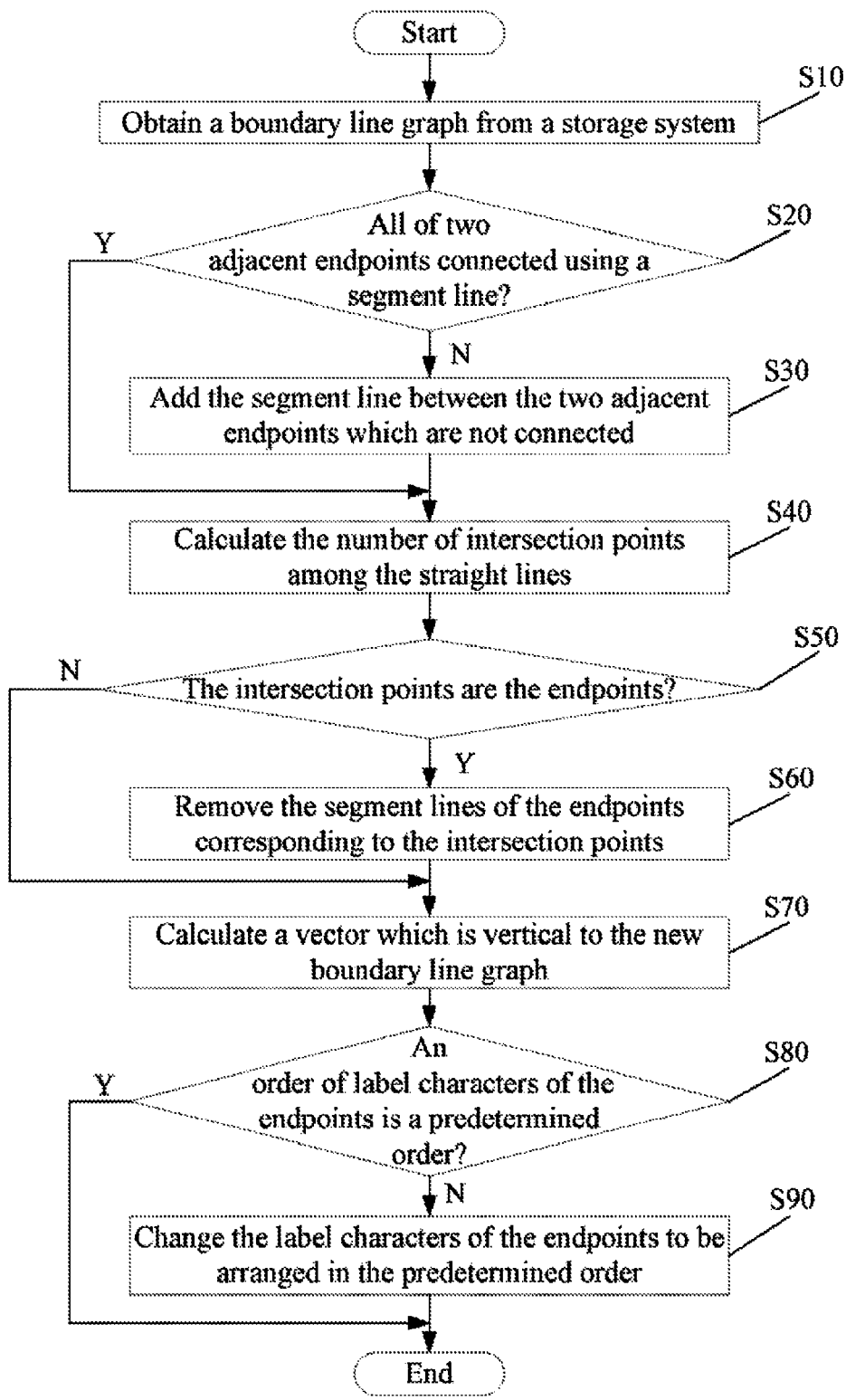
FIG. 3 is a flowchart illustrating one embodiment of a boundary line graph checking method.

FIG. 3 is a flowchart illustrating one embodiment of a boundary line graph checking method using the computing device 1 of FIG. 1. The method can be performed by the execution of a computer-readable program by the at least one processor 12. Depending on the embodiment, in FIG. 3, additional steps may be added, others removed, and the ordering of the blocks may be changed.

In step S10, the obtaining module 100 obtains a boundary line graph from the storage system 12.

In step S20, the determination module 102 determines if all of the two adjacent endpoints are connected using segment lines. In one embodiment, if the number of the endpoints is equal to the number of the formula of the segment lines, then all of the two adjacent endpoints are connected using the segment line, and the procedure goes to step S40. Otherwise, if the number of the endpoints is equal to the number of the formula of the segment lines, the procedure goes to step S30.

In step S30, the adding module 104 adds a segment line between the two adjacent endpoints which are not connected. For example, as shown in FIG. 4, the segment line is added between the endpoints A and F, and the formula of the segment line AF is generated by the coordinates of the endpoints A and F.

In step S40, the calculation module 106 calculates the number of intersection points among the segment lines. As mentioned above, the calculation module 106 uses the formula of the segment lines to calculate the coordinates of the intersection points, and then calculates the number of the intersection points.

In step S50, the determination module 102 determines if the number of the intersection points are equal to the number of the endpoints. If the number of the intersection points are unequal to the number of the endpoints, at least one or more intersection points are not the endpoints, then at least two segment lines do not intersect at the endpoints, and the procedure goes to step S60. Otherwise, if the number of the intersection points are equal to the number of the endpoints, the procedure goes to step S70.

In step S60, the removing module 108 searches for the intersection points which are not the endpoints, removes the segment lines of the endpoints corresponding to the intersection points. For example, as shown in FIG. 6, the removing module 108 removes three segment lines OG, OH and GF, and renames the intersection point O to be the label character of G, then the boundary line graph of FIG. 6 is changed to be FIG. 7.

In step S70, the calculation module 106 calculates a boundary line vector, which is vertical to the boundary line graph. For example, as shown in FIG. 8, the segment line DE is selected, and a midpoint Pt of the segment line DE is obtained. An inside point Pi is selected and the segment line PiPt is vertical to the segment line DE. The first vector V1 of the segment line DPt is calculated and the second vector V2 of the segment line PiPt is calculated. The boundary line vector is obtained by multiplying the first vector V1 and the second vector V2.

In step S80, the determination module 102 determines if an order of label characters of the endpoints is a predetermined order according to the boundary line vector. For example, if the boundary line vector V3 directs from the displaying device 2, the order of label characters of the endpoints is determined as the clockwise direction, and the procedure ends. If the boundary line vector V3 directs into the displaying device 2, the order of label characters of the endpoints is determined as the counterclockwise direction, and the procedure goes to step S90.

In step S90, the changing module 110 changes the label characters of the endpoints to be arranged in the predetermined order. In one embodiment, as shown in FIG. 9, the boundary line graph still starts from the endpoint A, and rest of the label character of the endpoints B to F is changed to the counterclockwise direction.

Although certain inventive embodiments of the present disclosure have been specifically described, the present disclosure is not to be construed as being limited thereto. Various changes or modifications may be made to the present disclosure without departing from the scope and spirit of the present disclosure.

What is claimed is:

1. A computing device, comprising:
   at least one processor;
   a storage system; and
   one or more programs stored in the storage system and being executable by the at least one processor, the one or more programs comprising:
   an obtaining module obtains a boundary line graph from the storage system, wherein the boundary line graph comprises a plurality of endpoints, and each endpoint is labeled with a label character;
   an adding module adds a segment line between two adjacent endpoints of the boundary line graph, if the two adjacent endpoints are not connected using the segment line;
   a calculation module calculates the number of intersection points among the segment lines;
   a removing module searches for the intersection points which are not the endpoints, removes the segment lines of the endpoints corresponding to the intersection points, if the number of the intersection points is not equal to the number of the endpoints;
   the calculation module further calculates a boundary line vector, which is vertical to the boundary line graph; and
   a changing module changes label characters of the endpoints to be arranged in a predetermined order, if an order of the label characters of the endpoints is not a predetermined order according to the boundary line vector.

2. The computing device as described in claim 1, wherein the boundary line graph further comprises a formula of each segment line which are generated by the two adjacent endpoints.

3. The computing device as described in claim 1, wherein the label characters of the two adjacent endpoints are consecutive in order.

4. The computing device as described in claim 1, wherein the order of the label characters of the endpoints is a clockwise direction or a counterclockwise direction.

5. The computing device as described in claim 4, wherein the order of the label characters of the endpoints is a clockwise direction upon the condition that the boundary line vector is directed from a displaying device connected to the computing device.

6. The computing device as described in claim 4, wherein the order of the label characters of the endpoints is a counterclockwise direction upon the condition that the boundary line vector is directed into the displaying device connected to the computing device.

7. A computer-implemented boundary line graph checking method being performed by execution of computer readable program code by a processor of a computing device, the method comprising:
   (a) obtaining a boundary line graph from a storage system of the computing device, wherein the boundary line graph comprises a plurality of endpoints, and each endpoint is labeled with a label character;
   (b) adding a segment line between two adjacent endpoints of the boundary line graph, when the two adjacent endpoints are not connected using the segment line;
   (c) calculating the number of intersection points among the segment lines;
   (d) searching for the intersection points which are not endpoints and removing the segment lines of the endpoints corresponding to the intersection points, when the number of the intersection points is not equal to the number of the endpoints;
   (e) calculating a boundary line vector which is vertical to the boundary line graph; and (f) changing label characters of the endpoints to be arranged in a predetermined order, when an order of the label characters of the endpoints is not a predetermined order according to the boundary line vector.

8. The method as described in claim 7, wherein the boundary line graph further comprises a formula of each segment line which are generated by the two adjacent endpoints.

9. The method as described in claim 7, wherein the label characters of the two adjacent endpoints are consecutive in order.

10. The method as described in claim 7, wherein step (e) further comprises:
   selecting a segment line of two endpoints selected in the boundary graph;
   obtaining a midpoint of the selected segment line of the two endpoints;
   selecting an inside point inside the boundary line graph, wherein the inside point satisfy the condition that the segment line generated by the inside point and the midpoint is vertical to the selected segment line of the two endpoints;
   calculating a first vector of the segment line of the two endpoints and a second vector of the segment line of the inside point and the midpoint; and
   multiplying the first vector and the second vector to generate the boundary line vector.

11. The method as described in claim 7, wherein the order of the label characters of the endpoints is a clockwise direction or a counterclockwise direction.

12. The method as described in claim 11, wherein the order of the label characters of the endpoints is a clockwise direction upon the condition that the boundary line vector is directed from a displaying device connected to the computing device.

13. The method as described in claim 11, wherein the order of the label characters of the endpoints is a counterclockwise direction upon the condition that the boundary line vector is directed into the displaying device connected to the computing device.

14. A non-transitory storage medium having stored thereon instructions that, when executed by a processor of a computing device, causes the computing device to perform a boundary line graph checking method, the method comprising:
   (a) obtaining a boundary line graph from a storage system of the computing device, wherein the boundary line graph comprises a plurality of endpoints, and each endpoint is labeled with a label character;
   (b) adding a segment line between two adjacent endpoints of the boundary line graph, when the two adjacent endpoints are not connected using the segment line;
   (c) calculating the number of intersection points among the segment lines;
   (d) searching for the intersection points which are not endpoints and removing the segment lines of the endpoints corresponding to the intersection points, when the number of the intersection points is not equal to the number of the endpoints;
   (e) calculating a boundary line vector which is vertical to the boundary line graph; and
   (f) changing label characters of the endpoints to be arranged in a predetermined order, when an order of the label characters of the endpoints is not a predetermined order according to the boundary line vector.

15. The non-transitory storage medium as described in claim 14, wherein the boundary line graph further comprises a formula of each segment line which are generated by the two adjacent endpoints.

16. The non-transitory storage medium as described in claim 14, wherein the label characters of the two adjacent endpoints are consecutive in order.

17. The non-transitory storage medium as described in claim 14, wherein the method of step (e) further comprises:
   selecting a segment line of two endpoints selected in the boundary graph;
   obtaining a midpoint of the selected segment line of the two endpoints;
   selecting an inside point inside the boundary line graph, wherein the inside point satisfy the condition that the segment line generated by the inside point and the midpoint is vertical to the selected segment line of the two endpoints;
   calculating a first vector of the segment line of the two endpoints and a second vector of the segment line of the inside point and the midpoint; and
multiplying the first vector and the second vector to generate the boundary line vector.

18. The non-transitory storage medium as described in claim 14, wherein the order of the label characters of the endpoints is a clockwise direction or a counterclockwise direction.

19. The non-transitory storage medium as described in claim 18, wherein the order of the label characters of the endpoints is a clockwise direction upon the condition that the boundary line vector is directed from a displaying device connected to the computing device.

20. The non-transitory storage medium as described in claim 18, wherein the order of the label characters of the endpoints is a counterclockwise direction upon the condition that the boundary line vector is directed into the displaying device connected to the computing device.

* * * * *